United States Patent [19]

Harada

[11] Patent Number: 5,434,515
[45] Date of Patent: Jul. 18, 1995

[54] LOGIC CIRCUIT IN WHICH IMPROVEMENT IS MADE ABOUT A TRANSITION SPEED AND CURRENT CONSUMPTION

[75] Inventor: Hiroshi Harada, Tokyo, Japan

[73] Assignee: NEC Corporation, Tokyo, Japan

[21] Appl. No.: 201,985

[22] Filed: Feb. 25, 1994

[30] Foreign Application Priority Data

Feb. 26, 1993 [JP] Japan .................. 5-062656

[51] Int. Cl.⁶ .................. H03K 19/08; H03K 19/01
[52] U.S. Cl. .................. 326/18; 326/84; 327/170
[58] Field of Search ............ 307/446, 443, 263, 296.3; 326/17, 18, 84, 86, 110, 21; 327/544, 170

[56] References Cited

U.S. PATENT DOCUMENTS

| | | | |
|---|---|---|---|
| 4,425,516 | 1/1984 | Wanlass | 307/446 |
| 4,791,320 | 12/1988 | Kawata et al. | 307/446 |
| 5,059,821 | 10/1991 | Murabayashi et al. | 307/446 |
| 5,079,447 | 1/1992 | Lien et al. | 307/446 |

FOREIGN PATENT DOCUMENTS 62-42614 2/1987 Japan .

Primary Examiner—Edward P. Westin
Assistant Examiner—Jon Santamauro
Attorney, Agent, or Firm—Young & Thompson

[57] ABSTRACT

For increasing an operation speed of a logic circuit in a case where an output level is shifted from a high level to a low level, a control circuit is made of a combination of a first control transistor and a second control transistor. An input circuit has a local terminal and produces a local signal in response to an input signal to supply the local signal to the local terminal. An output circuit has an output terminal and produces an output signal in response to the input and the local signals to supply the output signal to the output terminal. The first control transistor is connected between the local terminal and the second control transistor and has a first transistor control terminal which is supplied with the output signal for controlling operation of the first control transistor. The second control transistor is connected between the first control transistor and the ground and has a second transistor control terminal which is connected to the input terminal for controlling operation of the second control transistor.

7 Claims, 3 Drawing Sheets 5,434,515

LOGIC CIRCUIT IN WHICH IMPROVEMENT IS MADE ABOUT A TRANSITION SPEED AND CURRENT CONSUMPTION

BACKGROUND OF THE INVENTION

1. Field of the Invention

This invention relates to a logic circuit which is typically a combination of a complementary metal oxide semiconductor (CMOS) and a bipolar transistor. The combination will be called a bi-CMOS logic circuit throughout the specification.

2. Description of the Prior Arts

A conventional bi-CMOS logic circuit is disclosed in Japanese Patent Publication (Kokai or Prepublication of Unexamined Patent Application) No. 42614/1987. In the manner which will presently be described, the bi-CMOS logic circuit comprises an input terminal, an input circuit, an output circuit, and a control circuit.

The input terminal is supplied with an input signal. The input circuit has a local terminal and is connected to the input terminal for producing a local signal in response to the input signal to supply the local signal to the local terminal. The output circuit has an output terminal and is connected to the input and the local terminals for producing an output signal in response to the input and the local signals to supply the output signal to the output terminal. In the manner known in the art, the output signal has an output level which is a selected one of a high level and a low level. The control circuit is connected to the input, the local, and the output terminals for controlling the local signal in response to the input and the output signals.

The bi-CMOS logic circuit has, in a first case where the output level is shifted from the low level to the high level, a first operation speed or a first transition speed and, in a second case where the output level is shifted from the high level to the low level, a second operation speed or a second transition speed. In the manner known in the art, it is readily possible in the bi-CMOS logic circuit to increase the first transition speed.

As will later be described in detail with reference to the drawing, however, it is difficult in the bi-CMOS logic circuit to increase the second transition speed and to save current consumption during transition of the output level from the high level to the low level.

SUMMARY OF THE INVENTION

It is therefore an object of this invention to provide a logic circuit which is capable of increasing a transition or operation speed in shifting an output level from a high level to a low level.

It is another object of this invention to provide a logic circuit which is of the type described and which is capable of lowering current consumption during transition of the output level from the high level to the low level.

Other objects of this invention will become clear as the description proceeds.

According to this invention, there is provided a logic circuit comprising an input terminal supplied with an input signal, an input circuit having a local terminal connected to the input terminal for producing a local signal in response to the input signal to supply the local signal to the local terminal, an output circuit having an output terminal connected to the input and the local terminals for producing an output signal in response to the input and the local signals to supply the output signal to the output terminal, and a control circuit connected to the input, the local, and the output terminals for controlling the local signal in response to the input and the output signals. In the logic circuit, the control circuit comprises a first and a second control transistor. The first control transistor is connected between the local terminal and the second control transistor and has a first transistor control terminal which is connected to the output terminal for controlling operation of the first control transistor. The second control transistor is connected between the first control transistor and the ground and has a second transistor control terminal which is connected to the input terminal for controlling operation of the second control transistor.

Description of the Preferred Embodiments

Figure 1:
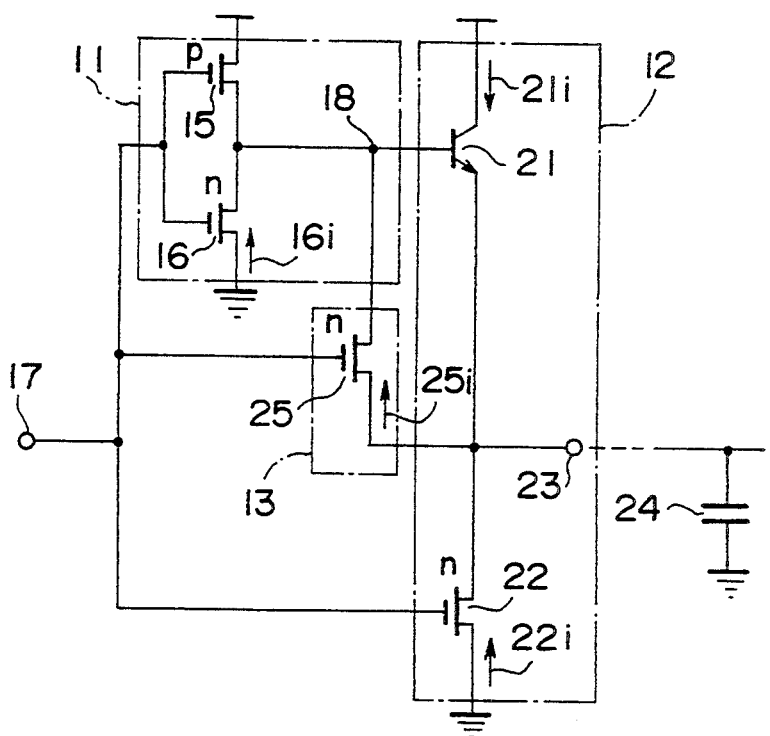
FIG. 1 is a circuit diagram of a conventional bi-CMOS logic circuit.

Referring to FIG. 1, description will at first be made as regards a conventional bi-CMOS logic circuit for a better understanding of this invention. In the manner which will presently be described, the conventional bi-CMOS logic circuit comprises an input circuit 11, an output circuit 12, and a control circuit 13.

The input circuit 11 comprises first and second input transistors 15 and 16. The first input transistor 15 is a p-channel metal oxide semiconductor (MOS) transistor which is connected between a power supply and the second input transistor 16 and has a gate connected to an input terminal 17. The second input transistor 16 is an n-channel MOS transistor which is connected between the first input transistor 15 and the ground and has a gate connected to the input terminal 17. A node or a local terminal 18 is connected between the first and the second input transistors 15 and 16. The input terminal 17 is supplied with an input signal which is represented by an electric voltage. Supplied with the input signal, the input circuit 11 produces a local signal which is represented by an electric voltage and is supplied to the local terminal 18. In the manner which will later become clear, the local signal has a selected one of a first voltage and a second voltage higher than the first voltage.

The output circuit 12 comprises first and second output transistors 21 and 22. The first output transistor 21 is an npn bipolar transistor which comprises a collector connected to the power supply, an emitter connected to the second output transistor 22, and a base connected to the local terminal 18. The second output transistor 22 is an n-channel MOS transistor connected between the emitter of the first output transistor 21 and the ground. The second output transistor 22 has a gate which is connected to the input terminal 17 and will be referred to as an output transistor control terminal. An output terminal 23 is connected between the first and the second output transistors 21 and 22. A load capacitance 24 is connected between the output terminal 23 and the ground and is for accumulating electric charge in the manner known in the art. Responsive to the input and the local signals, the output circuit 12 produce an output signal which is represented by an electric voltage and is supplied to the output terminal 23.

The control circuit 13 comprises a control transistor 25 which is an n-channel MOS transistor and is connected between the local and the output terminals 18 and 23. The control transistor 25 has a gate connected to the input terminal 17. Responsive to the input and the output signals, the control circuit 13 controls the local signal in the manner which will later become clear.

An arrow 16$i$ is representative of an electric current which flows between a source and a drain of the second input transistor 16 and will be called hereunder a second input transistor current. An arrow 21$i$ is representative of an electric current which flows between the collector and the emitter of the first output transistor 21 and will be called hereunder a first output transistor current. An arrow 22$i$ is representative of an electric current which flows between a source and a drain of the second output transistor 22 and will be called hereunder a second output transistor current. An arrow 25$i$ is representative of an electric current which flows between a source and a drain of the control output transistor 25 and will be called hereunder a control transistor current.

The description will be directed to operation of the conventional bi-CMOS logic circuit.

When the input signal has a relatively high voltage or a logic "1" level, the first input transistor 15 is turned off while the second input and the second output transistors 16 and 22 are turned on. In this state, the local terminal 18 is supplied with the local signal kept at the first voltage, so that the first output transistor 21 is turned off. As a result, the output terminal 23 produces the output signal having a relatively low voltage or a logic "0" level. Therefore, the electric charge is extracted from the load capacitance 24 to the ground through the second output transistor 22 in the manner known in the art.

When the input signal is shifted from the logic "1" level to a relatively low voltage or the logic "0" level, the first input transistor 15 is turned on while the second input and the second output transistors 16 and 22 are turned off. In this state, the local terminal 18 is supplied with the local signal kept at the second voltage, so that the first output transistor 21 is turned on. As a result, the output terminal 23 produces the output signal having the logic "1" level. Responsive to the output signal of the logic "1" level, the load capacitance 24 is charged with the electric charge to have the relatively high voltage.

When the input signal is shifted from the logic "0" level to the logic "1" level, the first output transistor 21 is turned off while the second output transistor 22 is turned on. In this event, the control transistor 25 is turned on to shunt between the base and the emitter of the first output transistor 21. Therefore, the first output transistor 21 is readily turned off to shift the output level from the logic "1" level to the logic "0" level. As a result, the electric charge is extracted from the load capacitance 24 to the ground through the second output transistor 22 in the manner known in the art.

It is to be noted here that the bi-CMOS logic circuit has, in a first case where the output level is shifted from the logic "0" level to the logic "1" level, a first operation speed or a first transition speed and, in a second case where the output level is shifted from the logic "1" level to the logic "0" level, a second operation speed or a second transition speed. In the manner known in the art, it is readily possible in the bi-CMOS logic circuit to increase the first transition speed. However, the conventional bi-CMOS logic circuit are incapable of improving the second transition speed. This is because the control transistor 25 is not fully effectively operative for the reason which will presently be described in detail.

When the input signal is shifted from the logic "0" level to the logic "1" level, the control transistor 25 itself is immediately turned on. However, substantially no electric current, namely, the control transistor current 25$i$ flows through the control transistor 25. This is because the control transistor 25 has a source and a drain between which potential difference is so small.

Figure 2:
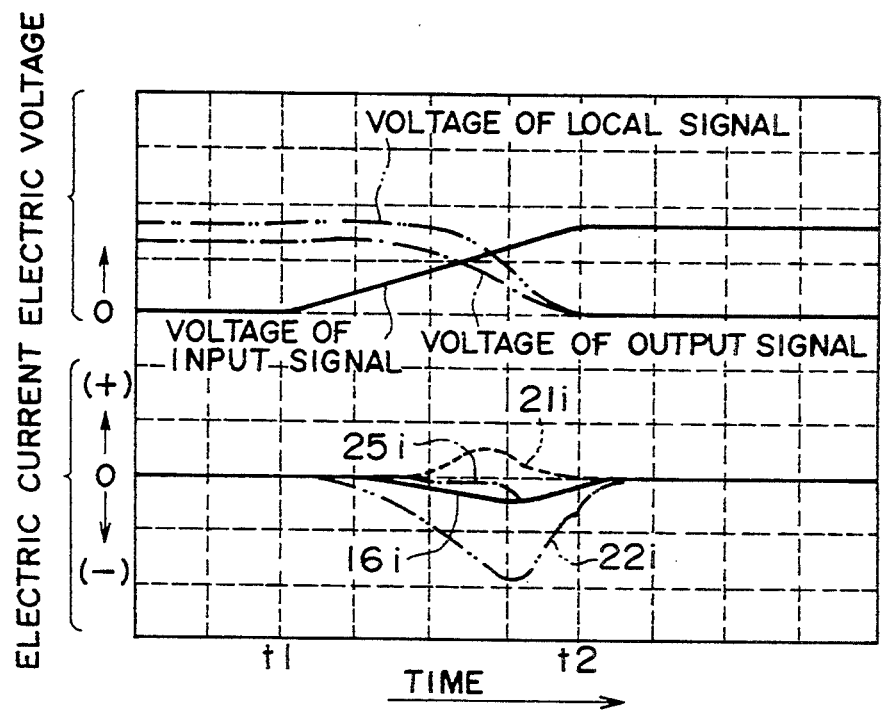
FIG. 2 is a graph for describing operation of the conventional bi-CMOS logic circuit illustrated in FIG. 1.

Referring to FIG. 2 together with FIG. 1, the description will be continued as regards the operation of the conventional bi-CMOS logic circuit. It is to be noted in FIG. 2 that an upper half portion indicates an electric voltage in relation to a lapse of time and that a lower half portion indicates an electric current in relation to the lapse of time. In the lower half portion, a positive electric current (+) flows in each of directions indicated by the arrows that are representative of the second input, the first output, the second output, and the control transistor currents 16$i$, 21$i$, 22$i$, and 25$i$ in FIG. 1, respectively.

The control transistor current 25$i$ has its peak level after the first output transistor current 21$i$ is decreased from its peak level with the electric charge being extracted at the local terminal 18 by the second input transistor current 16$i$. Accordingly, the second transition speed is decreased. In addition, the first output transistor current 21$i$ has a value which is relatively great while the output level is shifted from the relatively high voltage to the relatively low voltage. In other words, it is difficult to save current consumption during transition of the output level from the relatively high voltage to the relatively low voltage.

Figure 3:
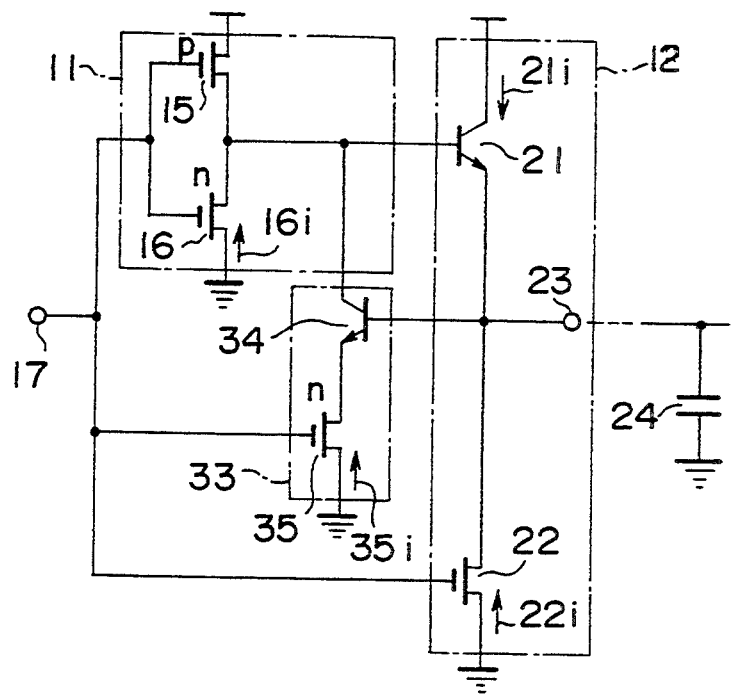
FIG. 3 is a circuit diagram of a bi-CMOS logic circuit according to a first embodiment of this invention.

Turning to FIG. 3, the description will now be made as regards a bi-CMOS logic circuit according to a first embodiment of this invention. The bi-CMOS logic circuit comprises similar parts designated by like reference numerals.

In addition, the bi-CMOS logic circuit in question comprises a control circuit 33 instead of the control circuit 13 that is described in conjunction with FIG. 1. As will presently be described, the control circuit 33 comprises first and second control transistors 34 and 35. The first control transistor 34 is an npn bipolar transistor comprising a collector connected to the local terminal 18, an emitter connected to the second control transistor 35, and a base which is connected to the output terminal 23 and will be referred to as a first transistor control terminal. The second control transistor 35 is an n-channel MOS transistor connected between the emitter of the first control transistor 34 and the ground. The second control transistor 35 has a gate which is connected to the input terminal 17 and will be referred to as a second transistor control terminal.. An arrow 35$i$ is representative of an electric current which flows between a source and a drain of the second control transistor 35 and will be called hereunder a second control transistor current.

Next, the description will be directed to operation of the bi-CMOS logic circuit.

It is assumed that the input terminal 17 is supplied with the input signal having the relatively high voltage or the logic "1" level. In this event, the first input transistor 15 is turned off while the second input, the second output, and the second control transistors 16, 22, and 35 are turned on. In this state, the local terminal 18 is supplied with the local signal kept at the first voltage, so that the first output transistor 21 is turned off. As a result, the output terminal 23 produces the output signal having the relatively low voltage or the logic "0" level. At this time, the electric charge is extracted from the load capacitance 24 to the ground through the second output transistor 22.

When the electric charge is extracted from the load capacitance 24, the output signal becomes the relatively low voltage. As a result, the first control transistor 34 is turned off. Accordingly, the second control transistor 35 is supplied with no current although it is turned on.

On the contrary, when the input signal is shifted from the logic "1" level to the logic "0" level, the first input transistor 15 is turned on while the second input, the second output, and the second control transistors 16, 22, and 35 are turned off. In this state, the local terminal 18 is supplied with the local signal kept at the second voltage, so that the first output transistor 21 is turned on. As a result, the output terminal 23 produces the output signal having the logic "1" level. Responsive to the output signal of the logic "1" level, the load capacitance 24 is charged to have the relatively high voltage. Therefore, the output signal is kept at the logic "1" level.

When the output signal becomes to have the logic "1" level, the first control transistor 34 is turned on but no electric current is supplied to the first control transistor 34. This is because the second control transistor 35 is turned off.

It is assumed here that the input signal is shifted from the logic "0" level to the logic "1" level. In this event, the first input transistor 15 is turned off while the second input, the second output, and the second control transistors 16, 22, and 35 are turned on as described in the foregoing. When the second control transistor 35 is turned on, a current path is formed between the local terminal 18 and the ground. This is because the first control transistor 34 is already kept in an on state. As a consequence, the electric charge is quickly extracted from the load capacitance 24 to the ground through the second output transistor 22. Thus, it is possible to increase the second transition speed and to reduce the first output transistor current 21$i$ that flows through the first output transistor 21 during a shift or a transition of the output signal in the second case.

Figure 4:
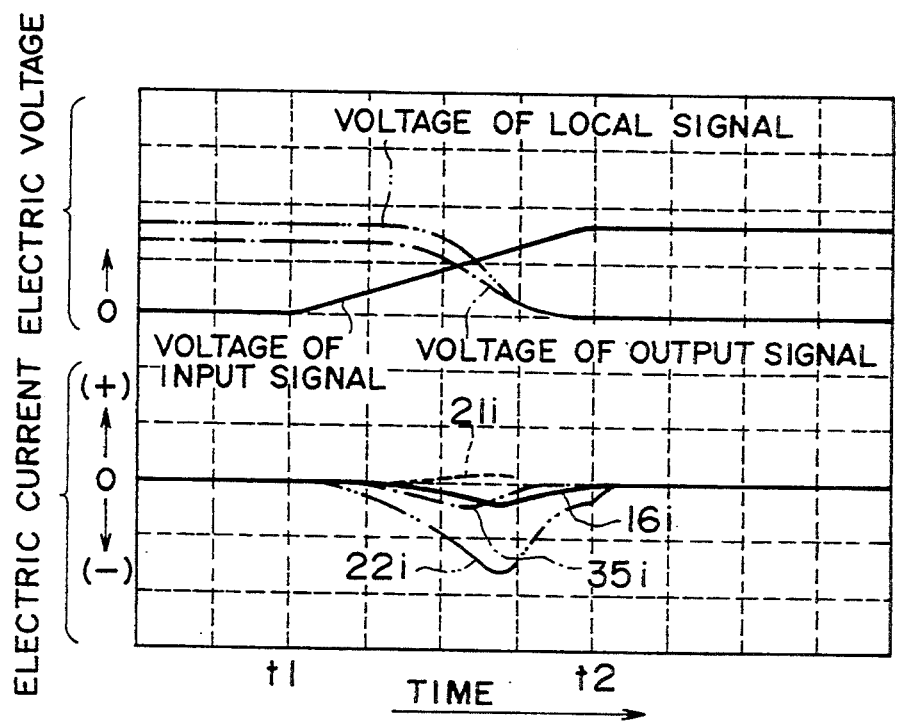
FIG. 4 is a graph for describing operation of the bi-CMOS logic circuit illustrated in FIG. 3.

Referring to FIG. 4 together with FIG. 3, the description will be continued as regards the operation of the bi-CMOS logic circuit. When the input signal is shifted from a logic "0" level to the logic "1" level between a first time instant t1 and a second time instant t2, the second control transistor current 35$i$ is immediately increased to flow through the second control transistor 35. This brings about reduction of the first output transistor current. 21$i$ flowing through the first output transistor 21 and the second output transistor current 22$i$ flowing through the second output transistor 22. In addition, each of the first and the second output transistor currents 21$i$ and 22$i$ rapidly reaches a peak level and a zero level in the electric current.

Accordingly, it is possible to increase the second transition speed. In addition, the first output transistor current 21$i$ is reduced, so that the current consumption is saved.

Figure 5:
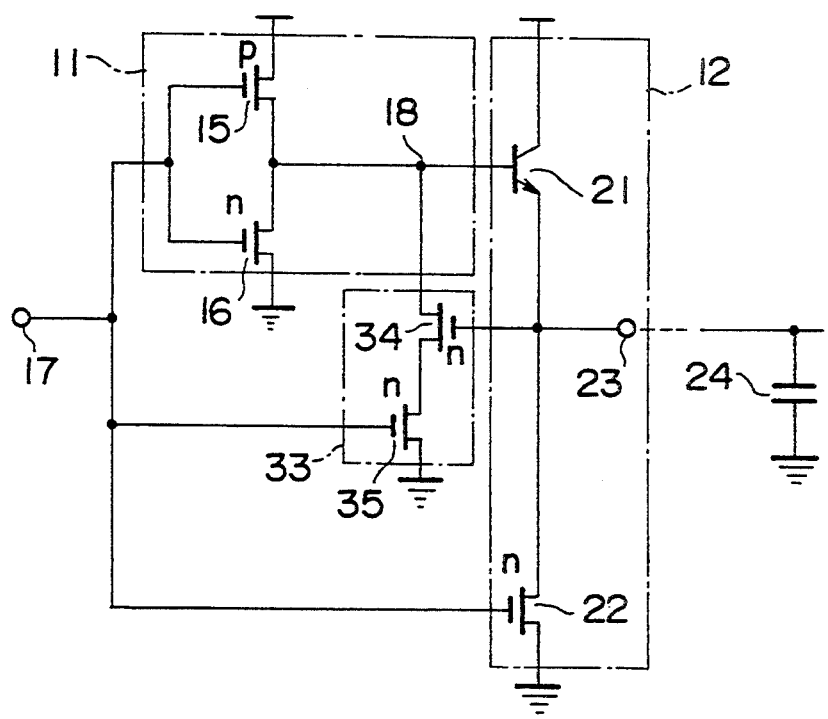
FIG. 5 is a circuit diagram of a bi-CMOS logic circuit according to a second embodiment of this invention.

Turning to FIG. 5, the description will be directed to a bi-CMOS logic circuit according to a second embodiment of this invention. The bi-CMOS logic circuit comprises similar parts designated by like reference numerals.

In the control circuit 33 of the bi-CMOS logic circuit, an n-channel MOS transistor is used as the first control transistor 34 instead of the npn bipolar transistor that is included in the control circuit 33 illustrated in FIG. 3. The n-channel MOS transistor, namely, the first control transistor 34 being exemplified is connected between the local terminal 18 and the second control transistor 35 and has a gate which is connected to the output terminal 23 and will be referred to as the first transistor control terminal.

The bi-CMOS logic circuit has operation which is substantially similar to that of the bi-CMOS logic circuit that is described in conjunction with FIG. 3. Therefore, the description will be omitted as regards the operation of the bi-CMOS logic circuit illustrated in FIG. 5.

While the present invention has thus far been described in connection with a few preferred embodiments thereof, it will readily be possible for those skilled in the art to put this invention into practice in various other manners within the scope of this invention. For example, a bipolar transistor may be used as each of the second output and the second control transistors.

What is claimed is:

1. A logic circuit comprising:
   an input terminal for being supplied with an input signal;
   an input circuit having a local terminal and connected to said input terminal for producing a local signal in response to said input signal to supply said local signal to said local terminal;
   an output circuit having an output terminal and connected to said input terminal and said local terminal for producing an output signal in response to said input signal and said local signal to supply said output signal to said output terminal; and
   a control circuit connected to said input terminal said local terminal, and said output terminal for controlling said local signal in response to said input Signal and said output signal, said output circuit being directly connected to said input terminal;
   said control circuit comprising a first and a second control transistor, said first control transistor being connected between said local terminal and said second control transistor and having a first transistor control terminal which is connected to said output terminal for controlling operation of said first control transistor, said second control transistor being connected, without being directly transistor and the ground and having a second transistor control terminal which is connected to said input terminal for controlling operation of said second control transistor.

2. A logic circuit as claimed in claim 1, wherein said input circuit comprises a first input transistor and a second input transistor, said first input transistor being connected between a power supply and said second input transistor and being a p-channel MOS transistor having a gate connected to said input terminal, said second input transistor being connected between said first input transistor and the ground and being an n-channel MOS transistor having a gate connected to said input terminal, said local terminal being connected between said p-channel MOS transistor and said n-channel MOS transistors.

3. A logic circuit as claimed in claim 1, wherein said output circuit comprises a first output transistor and a second output transistor, said first output transistor being connected between a power supply and said second output transistor and being an npn bipolar transistor having a base connected to said local terminal, said second output transistor being connected between said first output transistor and the ground and having an output transistor control terminal which is connected directly to said input terminal for controlling operation of said second output transistor, said output terminal being connected between said first output transistor and said second output transistor.

4. A logic circuit as claimed in claim 3, wherein said second output transistor is an n-channel MOS transistor having, as said output transistor control terminal, a gate directly connected to said input terminal.

5. A logic circuit as claimed in claim 1, wherein said first control transistor is an npn bipolar transistor having, as said first transistor control terminal, a base connected to said output terminal.

6. A logic circuit as claimed in claim 1, wherein said first control transistor is an n-channel MOS transistor having, as said first transistor control terminal, a gate connected to said output terminal.

7. A logic circuit as claimed in claim 1, wherein said second control transistor is an n-channel MOS transistor having, as said second transistor control terminal, a gate connected to said input terminal.

* * * * *